United States Patent [19]

Peiffer

[11] 4,054,483

[45] Oct. 18, 1977

[54] ADDITIVES PROCESS FOR PRODUCING PLATED HOLES IN PRINTED CIRCUIT ELEMENTS

[75] Inventor: Robert William Peiffer, Jackson, N.J.

[73] Assignee: E. I. Du Pont de Nemours and Company, Wilmington, Del.

[21] Appl. No.: 753,458

[22] Filed: Dec. 22, 1976

[51] Int. Cl.$^2$ .......................... C23F 1/02; H05K 1/00
[52] U.S. Cl. .................................... 156/632; 96/35.1; 96/38.4; 156/230; 156/247; 156/280; 156/634; 156/656; 156/660; 156/661; 156/902; 427/97; 427/98
[58] Field of Search ................................ 427/96–98; 96/35.1, 36.2, 38.4, 115 P; 174/68.5; 29/625; 156/230, 247, 249, 280, 629–634, 656, 659–661, 666, 901, 902

[56] References Cited

U.S. PATENT DOCUMENTS

| 3,661,576 | 5/1972 | Crary | 96/35.1 |
| 3,778,900 | 12/1973 | Haining et al. | 96/36.2 X |
| 3,948,701 | 4/1976 | Fasbender et al. | 156/630 |

*Primary Examiner*—William A. Powell

[57] ABSTRACT

An improved process for preparing printed circuit boards whereby through-holes are introduced into an element comprising a substrate, a photosensitive resist layer, and a superposed, strippable support. The through-holes are catalyzed prior to removal of the strippable support. After exposure the imaged photoresist is developed, the catalyzed-through-holes are electrolessly plated and the printed circuit is prepared using the developed image. Single sided, two or more layered printed circuit boards with plated-through-holes and interconnections can be prepared by this process.

15 Claims, No Drawings

ADDITIVES PROCESS FOR PRODUCING PLATED HOLES IN PRINTED CIRCUIT ELEMENTS

BACKGROUND OF THE INVENTION

1. Field of the Invention

This invention relates to printed circuit boards and particularly, to plating holes therein. More particularly this invention relates to the preparation of printed circuit boards with plated-through-holes using photosensitive elements in an additive plating process.

2. Description of the Prior Art

In preparing printed circuit boards conductive holes are introduced through the boards to accommodate insertion and soldering of electrical component leads. Conductive holes are conventionally introduced by drilling or punching holes through a copper clad, rigid board followed by a plating procedure. The holes are usually plated by a copper reduction procedure such as that disclosed in Chapter 5 of "Printed Circuits Handbook" edited by Clyde F. Coombs, Jr., published by McGraw-Hill Book Company, New York, New York, 1967 and in Chapter 6 of "Printed Circuits and Electronics Assemblies" edited by C. R. Draper, published by Robert Draper Ltd., Teddington, 1969. The copper clad board with plated-through-holes can then be processed into printed circuit boards using resists and processes as disclosed in the aforementioned "Printed Circuits Handbook" or in any one of a number of U.S. Pat. Nos. e.g., 3,469,982, 3,526,504, 3,547,730, 3,622,334, and 3,837,860. A disadvantage of the conventional copper reduction procedure for plating holes is the waste of expensive catalyst which adheres to the copper cladding as well as the holes, resulting in superfluous overplating of the copper cladding.

Printed circuits can also be prepared by depositing copper conductor patterns directly on insulating substrates by processes such as those disclosed in the following U.S. Pat. Nos. e.g., 3,060,024, 3,146,125, 3,259,559, 3,391,455, 3,506,482, 3,562,038, 3,628,999 and 3,791,858. In preparing printed circuits with plated-through-holes using electroless plating, cleaning procedures are frequently needed after activation of holes and circuit lines in order to remove unwanted catalyst from non-circuit areas before electroless plating. In addition to the cost of the cleaning procedures, expensive catalyst is wasted in the non-circuit areas.

SUMMARY OF THE INVENTION

In accordance with this invention there is provided a process for preparing printed circuit boards having plated-through-holes from a photosensitive element which comprises a substrate bearing, in order, a photosensitive layer and a strippable support capable of transmitting actinic radiation, wherein the photosensitive layer is imagewise expose, the strippable support is removed, the imaged photosensitive layer is developed, and the developed image is converted into a conductive printed circuit, which comprises, either prior to or after exposure, the step of 1. introducing through-holes into the element; and then
2. applying to the through-holes an adherent material which is catalytic to electroless plating or can be made catalytic by a development step;
3. removing the strippable support from the photosensitive layer; and
4. applying electroless plating solution to the catalyzed through-holes to produce an electrically conductive through-hole.

Multilayered printed circuit boards with plated-through-holes using photohardenable elements having an adherent, photohardenable layer and a strippable support that transmits actinic radiation are prepared by a process which comprises:

1. laminating the photohardenable surface of a photohardenable element to a substrate to form a laminated element;
2. exposing the laminated element imagewise through the support to actinic radiation;
3. removing the strippable support;
4. applying finely divided catalytic material to the exposed surface to form a catalytic image; and
5. treating the catalytic image with an electroless plating solution to form a printed circuit substrate;
6. laminating to the resultant printed circuit substrate the photohardenable surface of a photohardenable element; then in either order;
7. exposing the laminated element imagewise through the support to actinic radiation; and
8. introducing activated through-holes into the laminated element and applying to the holes an adhesive or an adherent material catalytic to electroless plating; then
9. removing the strippable support;
10. applying finely divided catalytic material to the exposed surface and the holes to form a catalytic image; and
11. treating the catalytic image and holes with an electroless plating solution to form a conductive printed circuit and holes.

Two-sided printed circuit boards having plated-through-holes from a photosensitive element which comprises a substrate bearing in order on each side a photosensitive layer and a strippable support capable of transmitting actinic radiation wherein the photosensitive layers are exposed imagewise, the strippable supports are removed, the imaged photosensitive layers are developed, and the developed images are converted into a conductive printed circuit are prepared by a process which comprises:

1. introducing through-holes into the element; and then
2. applying to the through-holes an adherent material catalytic to electroless plating;
3. removing the strippable supports from the photosensitive layers; and
4. applying electroless plating solution to the catalyzed through-holes to produce an electrically conductive through-hole.

DETAILED DESCRIPTION OF THE INVENTION

Printed circuit boards with plated-through-holes are prepared from photosensitive elements, preferably photohardenable elements, and more preferably, photopolymerizable elements. The preferred photohardenable element comprises a photohardenable layer with a thickness of about 0.0003 inches (~0.0008 cm) to about 0.01 inch (0.025 cm) having adhered thereto with low to moderate adherence a thin, flexible, polymeric film support which transmits radiation actinic to the photohardenable layer. The other side of the photohardenable layer may have adhered thereto a second protective coversheet with less adherence to the layer than adherence between the support and the layer.

In the processes of this invention where the totally additive, electroless plating procedure is to be used to form a printed circuit, the photohardenable layer should be adherent or tacky or capable of being made adherent by a suitable treatment, e.g., by heating. An electroless plating process for forming a printed circuit board with plated-through-holes using an adherent photohardenable element comprises; laminating the photohardenable surface of the element to a substrate to form a laminated element comprising, in order, the substrate, the photohardenable layer, and the transparent, strippable support. Then, in either order, the laminated element is imagewise exposed through the support and activated holes are introduced through the laminated element in register with the image. The activated holes are introduced by first drilling or punching holes in the laminated element followed by applying to the holes in the support surface an adherent material catalytic to electroless plating, e.g., conventional tin-palladium catalyst, or an adhesive material to which powdered catalyst can adhere. Imagewise exposure may occur before or after the catalyzed holes are introduced or between the steps of introducing the holes and applying the catalytic or adhesive material. After imagewise exposure and introduction of the activated holes, the strippable support is removed without transfer thereto of either exposed or underexposed areas of the photohardenable layer. Finely divided material catalytic to electroless plating, e.g., copper powder, is then applied to the surface of the layer and holes. The catalyst material adheres only to the underexposed areas and the surfaces of the holes which have been treated with adhesive to form a catalytic printed circuit image. After excess catalyst material has been removed the element is preferably baked to improve catalyst adhesion to the imaged layer. The laminated element with the catalytic printed circuit image is then treated with an electroless plating solution, e.g., by immersion, at least until a conductive printed circuit is formed.

A further process embodiment of this invention for forming a two-sided printed circuit board with plated-through-holes using an adherent photohardenable element comprises: laminating the photohardenable surface of a photohardenable element to each side of a substrate to form a laminated element comprising, in order, a strippable support, a photohardenable layer, a substrate, a second photohardenable layer, and a second strippable support. Then, in either order, each side of the laminated element is exposed imagewise through the supports and activated holes are introduced through the laminated element generally in register with the images. The activated holes can be introduced by drilling holes through the laminated element which then can be activated by immersing in a solution or suspension of an adhesive or an adherent material catalytic to electroless plating. After imagewise exposure and introduction of the activated holes, the strippable supports are removed and catalyst material is applied to each imaged layer surface. After excess catalyst material has been removed, and optionally, the element baked, the element is then treated with an electroless plating solution at least until conductive printed circuits and holes are formed.

A still further process embodiment of this invention for preparing multilayered printed circuit boards with plated-through-holes using an adherent photohardenable element comprises, (1) laminating the photohardenable surface of the photohardenable element to a substrate to form a laminated element, (2) exposing imagewise the laminated element through the support to actinic radiation, (3) removing the strippable support, (4) applying finely divided catalyst material to the exposed surface to form a catalytic image, and (5) treating the catalytic image with an electroless plating solution to form a printed circuit substrate, then, using the resultant printed circuit substrate, (6) laminating the photohardenable surface of a photohardenable element to the printed circuit substrate, then in either order, (7) exposing the laminated element imagewise through the support to actinic radiation and (8) introducing activated through-holes into the laminated element by drilling or punching holes and applying to the holes an adhesive or adherent material catalytic to electroless plating, then (9) removing the strippable support, (10) applying finely divided catalyst material to the exposed surface and the holes to form a catalytic image, and (11) treating the catalytic image and holes with an electroless plating solution to form a conductive printed circuit and holes. If more than two printed circuit layers are desired, steps 1 through 5 may be repeated one or more times before step 6 is initiated, or the original substrate in step 1 may have an existing printed circuit thereon which is prepared by any conventional process. Similarly, the reverse side of the substrate may be used as described above to increase the number of circuit layers. If interconnections between adjacent layers are desired, holes may be punched or drilled into the photohardenable layer before it is laminated in register to the printed circuit substrate.

In another preferred embodiment process, a printed circuit board with plated-through-holes is prepared from a photohardenable, and, particularly, a photopolymerizable resist forming element comprising a photohardenable layer having adhered thereto with low to moderate adherence a thin, flexible, polymeric, strippable support film which transmits radiation actinic to the photohardenable layer. The process of this embodiment comprises: (1) laminating the photohardenable surface of the photohardenable element to the copper surface of a copper clad substrate; then in either order, (2) exposing the element imagewise through the support to actinic radiation to imagewise produce photohardened and unhardened image areas, and (3) introducing, e.g., by drilling or punching, holes through the laminated element and substrate; then (4) applying to the holes from the support surface an adherent material catalytic to electroless plating; (5) removing the support; (6) removing the unhardened image areas; (7) applying electroless plating solution to the hole surface and exposed copper surface to form a continuous, electrically conductive, surface thereon; (8) depositing additional copper on the exposed copper surface by immersing in a plating bath; removing the resist image to expose protected, unplated, copper clad surface; and etching away the unplated coppr clad surface areas.

In this embodiment, numerous variations are possible. The copper surface of the copper clad substrate may be just thick enough to be conductive, e.g., up to about 0.0002 inch (0.0005 cm). In this instance, additional copper may be deposited on the exposed copper surface by immersing in an electroless or electrolytic plating bath to build a copper image sufficiently thick, e.g., about 0.0005 inch ($\sim$0.0013 cm) or more, to survive during the etching of the unplated, thin, copper clad surface. When a thicker copper surface of the copper clad substrate is used, conventional plating and etching methods may be used after the holes are electrolessly plated to produce printed circuit boards. Thus, additional copper is electrolytically plated on the exposed copper surface followed by electrolytic deposition of a masking metal surface such as gold or tin-lead. The resist image is then removed and the unmasked, copper clad surface is etched away. In another variation of the embodiment, a substrate coated with a catalytic material, e.g., such as that disclosed in U.S. Pat. Nos. 3,146,125, and 3,031,344, may be used in place of the copper clad substrate. In this instance, the steps would be substantially the same as those used with a copper clad substrate except that the final step of removing the hardened resist image need not be carried out if the catalytic surface of the substrate is not electrically conductive. A different catalytic material may be used to activate the hole surfaces, or the same catalytic material as used on the substrate surface may be used, particularly, if an activation step, such as that described in U.S. Pat. No. 3,146,125, is necessary. In still further variations, two-sided printed circuit boards with plated-through-holes can be prepared using the procedure described above with substrates having either copper clad surfaces or catalytic surfaces on both sides.

The process of the invention can be operated with many types of photohardenable elements. Useful elements comprise an adherent photohardenable layer contiguous to a strippable support which preferably transmits actinic radiation. The photohardenable layer includes photopolymerizable layers capable of addition polymerization and photocrosslinkable layers. Many specific examples of such photohardenable layers are set forth in the following U.S. Patents which are incorporated herein by reference: Nos. 3,469,982; 3,526,504; 3,547,730; 3,060,024; 3,622,334; 3,649,268 and French Pat. No. 72 11658. In these particular cases, the unexposed areas remain soluble and are removed by the developing step.

The processes may also be operated with positive working films such as the photosoluble compositions disclosed in U.S. Pat. No. 3,837,860 and the photodesensitizable compositions disclosed in U.S. Pat. No. 3,778,270. In both instances, exposed areas are removed to leave an image on the film. The basic requirement of the film is that imagewise exposure of the photosensitive layer either directly forms or can be rendered to form tacky and nontacky areas or soluble and insoluble areas where further machine processing will remove the soluble areas, leaving a resist image.

In still another embodiment of this invention, the aforementioned processes are repeated except that the substrate is coated with a layer of photosensitive, or photohardenable composition from a supply of fluid material rather than being laminated with a photosensitive layer. In this embodiment, the coated layer is laminated with a protective coversheet before catalyzed through holes are introduced through the coated element. The protective coversheet has low to moderate adherence to the photosensitive layer and is strippable from the coated layer and should be transparent to actinic radiation unless imagewise exposure occurs before the coversheet is applied to the coated layer. In the instance when multilayered printed circuit boards are being fabricated, the coversheet may be required only once, i.e., just before catalyzed through holes are introduced. Any conventional coating technique may be used in this embodiment, e.g., dip coating, spin coating, coating with a doctor knife, etc.

Photosensitive layers which directly form or can be processed to form tacky and nontacky image areas are particularly useful in forming printed circuits by the totally additive electroless plating process. In this process, finely divided material catalytic to electroless plating is adhered to the tacky image areas and then treated with an electroless plating solution to produce a conductive printed circuit. Such catalytic material may be finely divided, particulate metals or metal oxides such as titanium, aluminum, copper, gold, silver, palladium, zinc, cobalt, iron, nickel, titanous oxide, copper oxide, etc., or mixtures thereof. The finely divided catalytic material may be powders, slurries, colloidal suspensions or be coated carriers such as described in U.S. Pat. No. 3,031,344.

In practicing the invention, an element containing an image-yielding photopolymerizable stratum on a strippable support is preferably used. The photopolymerizable composition is present in a dry coating thickness of about 0.0003 inch (~0.0008 cm.) to about 0.01 inch (~0.025 cm.) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (~0.0006 cm.) to 0.008 inch (~0.02 cm.) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm.).

Suitable removable, protective, coversheet may be chosen from the same group of high polymer films described above and may have the same wide range of thicknesses. A coversheet of 0.001 inch (~0.0025 cm.) thick polyethylene is especially suitable. Supports and coversheets as described above provide good protection to the photopolymerizable resist layer. The photohardenable layer is prepared from polymeric components (binders), monomeric components, initiators and inhibitors.

Suitable binders which can be used as the sole binder or in combination with others include the following: Polyacrylate and alpha-alkyl polyacrylate esters, e.g., polymethyl methacrylate and polyethyl methacrylate; Polyvinyl esters, e.g., polyvinyl acetate, polyvinyl acetate/acrylate, polyvinyl acetate/methacrylate and hydrolyzed polyvinyl acetate; Ethylene/vinyl acetate copolymers; Polystyrene polymers and copolymers, e.g., with maleic anhydride and esters; Vinylidene chloride copolymers, e.g., vinylidene chloride/acrylonitrile; vinylidene chloride/methacrylate and vinylidene chloride/vinyl acetate copolymers; Polyvinyl chloride and copolymers, e.g., polyvinyl chloride/acetate; Saturated and unsaturated polyurethanes; Synthetic rubbers, e.g., butadiene/acrylonitrile, acrylonitrile/butadiene/styrene, methacrylate/acrylonitrile/butadiene/styrene copolymers, 2-chlorobutadiene/1,3-polymers, chlorinated rubber, and styrene/butadiene/styrene,styrene/isoprene/styrene block copolymers; High molecular weight polyethylene oxides of polyglycols having average molecular weights from about 4,000 to 1,000,000; Epoxides, e.g., epoxides containing acrylate or methacrylate groups; Copolyesters, e.g., those prepared from the reaction product of a polymethylene glycol of the formula HO(CH$_2$)$_n$OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; Nylons or polyamides, e.g., N-methoxymethyl polyhexamethylene adipamide; Cellulose esters, e.g., cellulose acetate, cellulose acetate succinate and cellulose acetate butyrate; Cellulose ethers, e.g., methyl cellulose, ethyl cellulose and benzyl cellulose; Polycarbonates; Polyvinyl acetal, e.g., polyvinyl butyral, polyvinyl formal; Polyformaldehydes.

Suitable monomers which can be used as the sole monomer or in combination with others include the following: t-butyl acrylate, 1,5 pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4 cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of Bisphenol-A, di-(2-methacryloxyethyl) ether of Bisphenol-A, di-(3-acryloxy-2-hydroxypropyl) ether of Bisphenol-A, di-(2-acryloxyethyl) ether of Bisphenol-A, di-(3-methacryloxy-2-hydroxypropyl) ether of tetrachloro-Bisphenol-A, di-(2-methacryloxyethyl) ether of tetrachloro-Bisphenol-A, di-(3-methacryloxy-2-hydroxypropyl) ether of tetrabromo-Bisphenol-A, di-(2-methacryloxyethyl) ether of tetrabromo-Bisphenol-A, di-(3-methacryloxy-2-hydroxypropyl) ether of 1,4-butane diol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4,butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5 pentanediol dimethacrylate, diallyl fumarate, styrene, 1,4 benzenediol dimethacrylate, 1,4-diisopropenyl benzene, and 1,3,5-triisopropenyl benzene.

In addition to the ethylenically unsaturated monomers mentioned above, the photohardenable layer can also contain at least one of the following free-radical initiated, chain-propagating, addition polymerizable, ethylenically unsaturated compounds having a molecular weight of at least 300. Preferred monomers of this type are: an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free-radical generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9.10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-napththoquinone, 9,10-phenanthrenequinone, 1,2-benzanthraquinone, 2,3-benzanthraquinone, 2-methyl-1,4-napthoquinone, 2,3-dichloronapthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4,-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon substituted aromatic acyloins, including α-methylbenzoin, α-allylbenzoin and α-phenylbenzoin. Photoreducible dyes are reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's Ketone, benzophenone, 2,4,5-triphenylimidazolyl dimers with hydrogen doners, and mixtures thereof as described in U.S. Pat. Nos. 3,427,161; 3,479,185 and 3,549,367, can be used as initiators.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil.

Various dyes and pigments may be added to increase the visibility of the resist image. Any colorant used, however, should preferably be transparent to the actinic radiation used.

In the process of this invention, catalyzed holes are inserted into a laminated element after the photohardenable layer has been adhered to a substrate to form the element, but always before the strippable support is removed from the photohardenable layer. Catalyzed holes may be inserted into the laminated elements either before or after imagewise exposure of the photohardenable layer to actinic radiation, or the holes may first be drilled or punched into the element before exposure and the holes catalyzed after exposure. In the instance where a photohardenable layer is laminated to both sides of a substrate, the catalyzed holes should preferably be inserted into the laminate before either strippable support is removed. In the instance where a printed circuit board is to be prepared having miltiple layers of circuits using the process of this invention, each printed circuit layer in turn forms a substrate to which a subsequent photohardenable layer is to be laminated. In this instance, catalyzed holes need only be inserted after the last photohardenable layer is laminated unless interconnections between circuit layers are desired. When such interconnections are desired, catalyzed holes can be inserted through the laminated element before subsequent photohardenable layers are laminated. When interconnections between adjacent circuit layers are desired, a photohardenable layer can be predrilled and then laminated in register to the circuit substrate.

Any method can be used to insert through-holes into the laminated element provided care is taken not to delaminate the photohardenable layer from either the substrate or the strippable support. Suitable methods of drilling, punching or piercing are disclosed in the aforementioned "Printed Circuits Handbook" and "Printed Circuits and Electronic Assemblies".

The through-holes in the laminated element may be catalyzed by the process of this invention by any procedure where a material is applied to the through-hole from the support surface which either directly renders the through-hole surface catalytic to electroless plating or modifies the through-hole surface to render it adherent to catalytic material. Preferably, the catalytic material applied does not adhere to the exposed surface of the strippable support. In one instance, the through-holes may be sensitized by tin and activated by palladium as described on page 177 of the aforementioned "Printed Circuits and Electronics Assemblies". The through-holes may also be treated with adherent catalyst such as the stannic acid-noble metal catalyst disclosed in U.S. Pat. No. 3,562,038. In another instance, the through-holes may be treated with a curable adhesive to which finely divided catalytic material adheres. The curable adhesive may be thermally cured such as the adhesive inks disclosed in U.S. Pat. No. 3,506,482 or photolytically cured such as solutions of tacky photohardenable composition herein disclosed. In either type, the curable adhesive is applied to the through-holes before the strippable support is removed. However, finely divided catalytic material, herein-before described, can be applied to the adhesive-coated through-hole either before or after the removal of the strippable support. When a tacky photohardenable layer is to be imagewise exposed and finely divided catalytic material is to be applied to form a catalytic image, only the removal of the strippable support is needed before the finely divided material is applied.

When unhardened areas of an image photohardenable layer are to be removed by a solvent, the solvent should not adversely affect the curable adhesive used, e.g., by dissolving it. In this instance, finely divided catalytic material is preferably applied either before the strippable support is removed or after the unhardened areas of the imaged layer have been removed. An advantage of using photolytically cured adhesive is that selected through-holes can be photohardened to make them non-receptive to catalytic material, e.g., when non-conductive alignment holes in the circuit board are desired. In this instance, of course, adhesive is applied to the holes before imagewise exposure to actinic radiation.

The adherent catalytic material or the adhesive material may be applied by any conventional method. Thus, these materials, which normally are liquid solutions or suspensions, can be applied dropwise to the through-holes or, preferably, the entire laminated element with through-holes therein can be dipped in the material. However, when the dipping procedure is used, in preparing a single sided printed circuit board care should be exercised to prevent the reverse side of the circuit board from being coated with the material, e.g., by a suitable masking procedure. With care, other procedures may also be used to apply the material, e.g, spraying, painting, etc.

EXAMPLES OF THE INVENTION

The invention will be illustrated by, but is not intended to be limited to the following examples wherein the percentages are by weight.

EXAMPLE 1

Single sided, printed circuit boards with plated-through-holes are prepared using a totally additive process of electroless plating and a photopolymerizable element of the type described in Celeste, U.S. Pat. No. 3,469,982. The element comprises a 0.0018 inch ($\sim$0.0046 cm.) thick, tacky, photopolymerizable layer having on one surface a 0.001 inch ($\sim$0.0025 cm) thick, polyethylene terephthalate film support which is strippable from the layer, and on the other surface a 0.001 inch ($\sim$0.0025 cm) thick strippable polyethylene coversheet having less adhesion to the layer than has the support. The tacky photopolymerizable layer contains, as major ingredients: 40% of an unsaturated polyurethane having 0.5% unsaturation and a molecular weight of 1,900; 20% of an acrylonitrile/butadiene/styrene copolymer having a specific gravity of $\sim$1.07; 30% trimethylolpropane triacrylate; 5% benzophenone; and 5% 4,4'-bis (dimethylamino)benzophenone. In its unexposed state, the layer adherently retains copper powder and in its exposed state the layer does not retain copper powder.

The polyethylene coversheet is removed from the photopolymerizable layer, and the surface of the layer is laminated by means of heated pressure rollers to a 3×5 inch ($\sim$7.6 ×12.7 cm) glass-epoxy G10 circuit board similar to that described on page 2–18 of the aforementioned "Printed Circuit Handbook". The laminated photopolymerizable element is imagewise exposed for 25 seconds through a contact positive transparency of the circuit pattern to ultraviolet radiation of a 400 watt, medium pressure, mercury vapor lamp in a Model DMVL Double Sided Exposure Frame, a product of Colight, Inc.

Through-holes are introduced into the exposed laminated element by drilling holes in the pad areas of the unexposed circuit pattern, using a 1.5 mm drill at 15,000 rpm. The entire drilled and exposed board element is dipped for a few seconds in a 20% methylene chlordie solution of the same photopolymerizable composition as that used in the film, and the excess solution is removed with a stream of air. Photopolymerizable material is removed from the reverse board surface by wiping with solvent.

The strippable support is removed from the imaged photopolymerizable layer and copper powder having an average particle size of 11 μm is dusted onto the exposed surface and into the through holes. Excess copper is removed with a fine spray of water to give a clean, clearly defined, catalyzed circuit patterna. The board with the catalyzed pattern and holes is immersed in an electroless copper plating solution similar to that of Example II of Zeblisky et al., U.S. Pat. No. 3,095,309. After 1 hour, copper deposited in the holes and on the surface to form a conductive pattern.

EXAMPLE 2

A 3×5 inch, laminated, board element comprising in order a glass-epoxy B10 board, a 0.0018 inch thick photopolymerizable layer similar to that described in Example 1 and a 0.001 inch thick polyethylene terephthalate support is prepared as in Example 1. Through-holes are introduced into the imagewise exposed board element as in Example 1 except that the holes are drilled prior to imagewise exposure.

The imaged board with through-holes therein is immersed in a tin-palladium colloidal solution prepared as in Example 7 of Shipley et al. U.S. Pat. No. 3,562,038. After soaking for ten minutes, the board element is washed with distilled water, the reverse side of the board is wiped to remove any adhered catalyst, and the board is dried.

The strippable support is removed from the imaged photopolymer layer; and as in Example 1, copper powder is applied to form a catalytic image and the board with catalyzed pattern and holes is immersed in an electroless plating solution. Within one hour a conductive pattern connecting the surface with the holes is obtained.

EXAMPLE 3

A two-sided, printed circuit board with plated-through-holes is prepared using the totally additive process of electroless plating described in Example 2 and the photosensitive element of Example 1.

After the polyethylene coversheets in the elements are removed, the photopolymerizable layers of two elements are laminated to the sides of a 3×5 inch (∼7.6 × 12.7 cm) glass-epoxy G10 circuit board using heated pressure rollers. Through-holes are introduced into the laminated element in a desired pattern of drilling holes using a 1.5 mm drill at 15,000 rpm. Both sides of the laminated element are imagewise exposed to actinic radiation through complementary contact positive transparencies of circuit patterns in register with the through-holes in the element using the exposure source of Example 1.

The imaged board element with through-holes therein is immersed in a tin-palladium colloidal solution, as in Example 2, for ten minutes, is washed with distilled water and is dried.

The strippable support is removed from the photopolymer layer on each side of the laminated element and copper powder is dusted onto the surfaces. After removing excess copper powder with a fine water spray, the laminated element is baked at 160° C. for 30 minutes to improve adhesion of the copper powder to the photopolymer layers. The board with catalyzed pattern and holes is immersed in an electroless copper plating solution of Example 1. Within one hour, a conductive pattern is obtained on both sides of the sample and in the through-holes so that circuit patterns are conductive from one side of the element to the other side through the plated-through-holes. To improve the ductility of the copper, the two-sided printed circuit board is baked for 1 hour at 160° C.

EXAMPLE 4

A multilayered, printed circuit board having plated-through-hole interconnections between two layers is prepared by the following electroless plating process. A two-sided, printed circuit board with plated-through-holes is prepared as in Example 3. A photopolymerizable layer is laminated to each side of the two sided, printed circuit board and imagewise exposed through contact positive transparencies of circuit patterns using the photosensitive element and procedure described in Example 1. The strippable support is removed from the photopolymer layer on each side of the laminated element and copper powder is dusted onto the surfaces. After removing excess copper powder with a fine water spray, the laminated element is baked for 65 min. at 160°–165° C. and then is immersed in electroless plating of Example 1 for 8 hours to form conductive circuits on the two sides of the laminated element. The resulting multilayered printed circuit board consists of two printed circuit layers interconnected by plated-through-holes, sandwiched between and electrically insulated from two additional printed circuit layers.

EXAMPLE 5

Using photosensitive elements described in Example 1, the polyethylene coversheets are removed and the photopolymerizable layers of the two elements are laminated to the sides of a 3×5 inch (∼7.6 × 12.7 cm) glass-epoxy G10 circuit board by passing between heated pressure rollers. Both sides of the laminated elements are imagewise exposed for 25 seconds using the exposure source of Example 1 to actinic radiation through complimentary contact positive transparencies of circuit patterns. The strippable support is removed from the photopolymer layer on each side of the laminated element and copper powder described in Example 1 is dusted onto the surfaces. After removing excess copper powder with a fine water spray, the laminated element is baked at 160° C for 30 minutes and the board is immersed in an electroless copper plating solution of Example 1 for 8 hours until conductive circuits are obtained. The two sided printed circuit board is then baked at 160° C for 1 hour.

Two photosensitive element sheets are stacked together and taped to a rigid board. Holes are then drilled in the film at locations corresponding to pads in the circuit pattern of the two sided board using a 1.5 mm drill at 15,000 rpm. The polyethylene coversheet of each predrilled element is removed and each photopolymerizable layer is laminated to a side of the two sided printed circuit element so that the predrilled holes are in register with pads of the underlying printed circuit. Both sides of the laminated element are imagewise exposed as above described through transparencies of complimentary circuit patterns. The exposed photopolymerizable layers are dusted with copper powder, baked and electrolessly plated as described above to give 4-layered printed circuit board in which the two layers on each side of the epoxy glass board are interconnected by plated-holes through the surface layer.

The polyethyelene coversheets of two additional photosensitive elements are removed, and the photopolymerizable layers are laminated as described above to each side of the 4-layered circuit element. Through-holes are introduced into the laminated element in register with the underlying printed circuit patterns by drilling holes using a 1.5 mm drill at 15,000 rpm. Both sides of the laminated element are imagewise exposed as described above to actinic radiation through complimentary contact positive transparencies of circuit patterns in register with through-holes in the element. The imaged board element with through-holes therein is immersed in a tin-palladium colloidal solution, as in Example 2, for 10 minutes, washed with distilled water and dried.

The strippable support is removed from the photopolymer layer on each side of the laminated element and copper powder is dusted onto the surfaces. After removing excess copper powder with a fine water spray, the laminated element is baked at 160° C. for 30 minutes and then the board with catalyzed patterns and holes is immersed in an electroless copper plating solution of Example 1. Within one hour a conductive pattern is obtained on both sides of the sample and in the through-holes so that all six circuit patterns are interconnected by conductive plated-through-holes passing from one side of the element to the other side. The six-layered, interconnected, printed circuit board is baked for 1 hour at 160° C.

EXAMPLE 6

A two-sided, printed circuit board with plated through holes is prepared using a thin copper-clad epoxy-fiberglass board and a conventional film photoresist element.

A photopolymerizable solution prepared as in Example VII of U.S. Pat. No. 3,469,982 is coated onto a 0.001 in. (0.0025 cm) thick polyethylene terephthalate strippable support film and dried in air. A coversheet film of 0.001 inch thick polyethylene is then laminated to the dried coating to form a photopolymerized photoresist element.

The coversheet is removed from the element, and the surface of the photopolymerizable layer is laminated to the copper surface on each side of a cleaned thin-clad epoxy-film glass board having a copper clad thickness of about 0.0001 inch (~0.00025 cm) on each side. The laminated photopolymerizable element is imagewise exposed on both sides for 90 seconds contact positive transparencies using a carbon arc source (a nuArc Plate Maker Model No. FT-26M-2 of the flip top type, manufactured by the nuArc Co., Inc.).

Six through-holes are introduced into the exposed laminated element by drilling holes in the pad areas of the unexposed circuit patterns, using a 1.5 mm drill of 15,000 rpm. The imaged board element with through-holes therein is immersed in a tin-palladium colloidal solution prepared as in Example 7 of U.S. Pat. No. 3,562,038. After soaking for ten minutes, the board element is rinsed with distilled water and the board is dried.

The polyethylene terephthalate strippable supports are removed from the imaged surfaces and the imaged layers are developed by washing away unexposed areas in a spray of methylchloroform to give a resist image on each side of the element. The sample is baked for 30 min. at 160° -165° C after which it is immersed in an electroless copper plating solution similar to that of Example II of U.S. Pat. No. 3,095,309 for 8 hours. After a complete water rinse the resist images are removed by immersing the sample in dichloromethane. The sample is then treated with 41° Baume ferric chloride solution for 45 seconds until a printed circuit is obtained on each side of the board with plated-through-hole interconnection.

EXAMPLE 7

A multilayered printed circuit board with plated interconnections between layers and plated-through-holes is prepared using the two sided printed circuit board of Example 6 coated thereon with a photopolymerizable composition and the electroless plating process.

A two-sided printed circuit board with plated-through-holes prepared as in Example 6 is dip coated in a photopolymerizable solution prepared as in Example 1 (Solution A) of U.S. Pat. No. 3,649,268. The coating is allowed to dry at 55° C and a 0.001 inch (~0.0025 cm) film of polyethylene terephthalate is laminated to each coated side of the circuit board.

Through-holes are introduced into the laminated element by drilling holes in pad areas of the circuit patterns to be imaged using a 1.5 mm drill at 15,000 rpm. The through-holes are then activated with tin-palladium catalyst as in Example 6, and the element is imagewise exposed on both sides for 5 seconds through contact positive transparencies in register, using the carbon arc source of Example 6.

The polyethylene terephthalate films are removed from the imaged photopolymer layer on each side of the element and copper powder is dusted onto the surface. After removing excess copper powder with a fine water spray, the element is baked at 160° C for 30 minutes to improve adhesion of the copper to the photopolymer layers. The board with catalyzed pattern and holes is immersed in an electroless copper plating solution of Example 1. Within one hour, a conductive pattern is obtained on both sides of the sample and in the through-holes; so that the four circuit patterns are conductive from one side of the element to the other side through the plated-through-holes. In addition, the two interior circuit patterns are interconnected by plated-through-holes in the fiberglass epoxy boards.

EXAMPLE 8

A single sided, printed circuit board with plated through holes is prepared using a conventional copper-clad epoxy-fiberglass board and a conventional film photoresist element.

A photoresist element comprising a photopolymerizable layer on a polyethylene terephthalate strippable support film is prepared as described in Example 6. The photopolymerizable surface of the element is laminated to the copper surface of a cleaned, copper clad, epoxy-fiberglass board having a copper clad thickness of about 0.0013 inches (0.0033 cm). The laminated photopolymerizable element is imagewise exposed through a contact positive transparency as described in Example 6.

The reverse nonmetallic side of the epoxy fiberglass board is covered with an adhesive masking tape and through-holes are drilled into the pad areas of the exposed laminated element as described in Example 6. The imaged board element with through-holes therein is immersed in a tin-palladium colloidal solution prepared as described in Example 7 of U.S. Pat. No. 3,562,038. After soaking for ten minutes, the board element is rinsed with distilled water, the masking tape is removed and the board is dried.

The polyethylene terephthalate sheet is removed from the imaged surface and the imaged layer is developed by washing away unexposed areas in a spray of methylchloroform to give a resist image on the copper surface. The sample is baked for 30 minutes at 165° C., is immersed in an electroless copper plating solution similar to that described in Example II of U.S. Pat. No. 3,095,309 for 1 hour until a conductive surface forms in the through-holes and is then rinsed with water.

The resist copper board is placed in a conventional copper sulfate plating bath and copper is deposited electrolytically for 15 minutes on the unprotected non-resist areas and holes of the imated copper-clad boards after which it is removed from the bath and air dried. The electrolytically-deposited copper of the board element is then plated over with a metal which is insoluble in ferric chloride solution, e.g., gold, and then the resist is stripped off using dichloromethane. The sample is then etched with 45° Baumé ferric chloride solution until a printed circuit is formed with plated-through-holes.

EXAMPLE 9

A printed circuit board with plated-through-holes is prepared from a catalyzed support coated with a photohardenable resist using an electroless plating procedure.

A catalyzed support is prepared by coating on epoxy-resin-cuprous oxide composition of Example I of U.S. Pat. No. 3,146,125 on a glass-epoxy G10 circuit board and curing it thereon. The catalyzed support is then coated with a polyvinyl cinnamate photocrosslinkable solution described in Example I of U.S. Pat. No. 3,526,504. After the photocrosslinkable layer is dried, a 0.001 inch thick polyethylene terephthalate strippable support film is laminated to its surface.

The laminated element is imagewise exposed as described in Example 6 for 18 minutes. Activated through-holes are introduced into the exposed laminated element by drilling and catalyzing holes in the pad areas of the unexposed circuit pattern as described in Example 8.

The strippable support is removed from the imaged surface and the layer is developed by removing unexposed areas in a trichloroethylene vapor spray for 30 seconds. The sample is baked for 30 minutes at 165° C. An aqueous solution of 30° Baumé sulfuric acid is then applied to the exposed catalytic surface and is allowed to remain in contact for 10 minutes. The acid is then removed by thorough rinsing, and the catalyst element is immersed in an electroless copper plating bath of Example 6 for 10 hours. After a complete water rinse, the copper printed circuit board with plated-through-holes is baked for 1 hour at 160° C. to improve the ductility of the copper.

I claim:

1. A process for preparing printed circuit boards having plated through-holes from a photosensitive element which comprises a substrate bearing, in order, a photosensitive layer and a strippable support capable of transmitting actinic radiation, wherein the photosensitive layer is imagewise exposed, the strippable support is removed, the imaged photosensitive layer is developed, and the developed image is converted into a conductive printed circuit, which comprises, either prior to or after exposure, the steps of:
   1. introducing through-holes into the element; and then
   2. applying to the through-holes an ahderent material which is catalytic to electroless plating or can be made catalytic by a development step;
   3. removing the strippable support from the photosensitive layer; and
   4. applying electroless plating solution to the catalyzed through-holes to produce an electrically conductive through-hole.

2. A process according to claim 1 wherein the substrate has a printed circuit pattern on its reverse side.

3. A process according to claim 1 wherein the adherent material is applied to the holes from the support surface.

4. A process according to claim 1 wherein the photosensitive element is prepared by coating the substrate with a liquid to form a photosensitive layer and laminating to said layer the strippable support.

5. A process according to claim 1 wherein the photosensitive element is prepared by laminating the surface of the supported photosensitive layer to the substrate.

6. A process according to claim 5 wherein the photosensitive layer is an adherent photohardenable layer.

7. A process according to claim 6 wherein the support is removed in step (3) without transfer thereto of either exposed or underexposed areas of the layer; after step (3) and prior to step (4) the imaged layer is developed by applying to the surface of the layer and the holes therein finely divided material catalytic to electroless plating which adheres to the underexposed areas to produce a catalytic image; and the electroless plating solution is applied in step (4) to the catalytic image and hole surface to produce an electrically conductive circuit.

8. A process according to claim 1 wherein the photosensitive element comprises a substrate having a surface which is electrically conductive or catalytic to electroless plating bearing a photosensitive resist forming layer which upon imagewise exposure to actinic radiation imagewise produces areas which are removable from the layer, and a strippable support.

9. A process according to claim 8 wherein the substrate surface is electrically conductive and wherein the image layer is developed with or subsequent to step (3) by removing the removable image areas to form a resist image on the substrate; electroless plating solution is applied in step (4) to the holes and exposed substrate surface to form an electrically conductive surface thereon; the resist image is removed to expose protected electrically conductive substrate areas; and the protected electrically conductive substrate areas are removed.

10. A process according to claim 8 wherein substrate surface is catalytic to electroless plating and wherein the image layer is developed during or subsequent to step (3) by removing the removable image areas to form a resist image on the catalytic substrate; electroless plating solution is applied in step (4) to the holes and catalytic substrate surface to form an electrically conductive surface thereon.

11. A process according to claim 9 wherein the electrically conductive surface is copper or a copper clad substrate and wherein after step (4) and before removing the resist image depositing additional copper on the exposed copper surface by immersing in a plating bath; and after removing the resist image etching away the unplated copper areas of the substrate.

12. A process for preparing multilayered printed circuit boards with plated-through-holes using photohardenable elements having an adherent, photohardenable layer and a strippable support that transmits actinic radiation which comprises:
   1. laminating the photohardenable surface of a photohardenable element to a substrate to form a laminated element;
   2. exposing the laminated element imagewise through the support to actinic radiation;
   3. removing the strippable support;

4. applying finely devided catalytic material to the exposed surface to form a catalytic image; and
5. treating the catalytic image with an electroless plating solution to form a printed circuit substrate;
6. laminating to the resultant printed circuit substrate the photohardenable surface of a photohardenable element; then in either order;
7. exposing the laminated element imagewise through the support to actinic radiation; and
8. introducing activated through-holes into the laminated element and applying to the holes an adhesive or an adherent material catalytic to electroless plating; then
9. removing the strippable support;
10. applying finely divided catalytic material to the exposed surface and the holes to form a catalytic image; and
11. treating the catalytic image and holes with an electroless plating solution to form a conductive printed circuit and holes.

13. A process according to claim 12 wherein steps 1 through 5 are repeated at least once prior to the initiation of step 6.

14. A process according to claim 12 wherein holes are introduced into the photohardenable element prior to lamination to the printed circuit substrate.

15. A process for preparing two-sided printed circuit boards having plated-through-holes from a photosensitive element which comprises a substrate bearing in order on each side a photosensitive layer and a strippable support capable of transmitting actinic radiation wherein the photosensitive layers are exposed imagewise, the strippable supports are removed, the imaged photosensitive layers are developed, and the developed images are converted into a conductive printed circuit, which comprises, either prior to or after exposure, the steps of:
1. introducing through-holes into the element; and then
2. applying to the through-holes an adherent material catalytic to electroless plating;
3. removing the strippable supports from the photosensitive layers; and
4. applying electroless plating solution to the catalyzed through-holes to produce an electrically conductive through-hole.

* * * * *